United States Patent
Choi et al.

(10) Patent No.: US 11,114,362 B2
(45) Date of Patent: Sep. 7, 2021

(54) STACKED SEMICONDUCTOR PACKAGE HAVING HEAT DISSIPATION STRUCTURE

(71) Applicant: SK hynix Inc., Icheon-si (KR)

(72) Inventors: Bok Kyu Choi, Yongin-si (KR); Jong Hoon Kim, Suwon-si (KR); Ki Bum Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/668,979

(22) Filed: Oct. 30, 2019

(65) Prior Publication Data

US 2021/0005527 A1    Jan. 7, 2021

(30) Foreign Application Priority Data

Jul. 3, 2019 (KR) .......................... 10-2019-0079779

(51) Int. Cl.
*H01L 23/367* (2006.01)
*H01L 23/373* (2006.01)
*H01L 25/065* (2006.01)
*H01L 23/31* (2006.01)

(52) U.S. Cl.
CPC ...... *H01L 23/3672* (2013.01); *H01L 23/3171* (2013.01); *H01L 23/3736* (2013.01); *H01L 25/0657* (2013.01)

(58) Field of Classification Search
CPC ............. H01L 23/3672; H01L 23/3171; H01L 23/3736; H01L 25/0657
See application file for complete search history.

(56) References Cited

U.S. PATENT DOCUMENTS

| 2009/0302445 | A1* | 12/2009 | Pagaila | ............... H01L 25/0657 257/678 |
| 2014/0084444 | A1* | 3/2014 | Lin | ....................... H01L 23/481 257/698 |
| 2018/0190617 | A1 | 7/2018 | Chew | |

FOREIGN PATENT DOCUMENTS

KR    101069499 B1    9/2011

* cited by examiner

*Primary Examiner* — Peniel M Gumedzoe
(74) *Attorney, Agent, or Firm* — William Park & Associates Ltd.

(57) ABSTRACT

A stacked semiconductor package includes a first die, a second die stacked on a surface of the first die, a heat dissipation layer disposed on the surface, a heat insulation layer disposed on the surface to cover the heat dissipation layer and the first die, a heat sink disposed on the second die, and a heat conduction structure spaced apart from the second die in a lateral direction on the surface to connect the heat dissipation layer to the heat sink.

20 Claims, 4 Drawing Sheets

STACKED SEMICONDUCTOR PACKAGE HAVING HEAT DISSIPATION STRUCTURE

CROSS-REFERENCE TO RELATED APPLICATION

The present application claims priority under 35 U.S.C. 119(a) to Korean Patent Application No. 10-2019-0079779, filed on Jul. 3, 2019, which is herein incorporated by reference in its entirety.

BACKGROUND

1. Technical Field

The present disclosure generally relates to semiconductor packages and, more particularly, to stacked semiconductor packages having a heat dissipation structure.

2. Related Art

Generally, each of semiconductor packages is configured to include a substrate and a semiconductor chip mounted on the substrate. The semiconductor chip may be electrically connected to the substrate through a connector, such as bumps or wires.

Recently, in accordance with demands for higher performance and higher integration of the semiconductor packages, various structures of the semiconductor packages, stacking a plurality of semiconductor chips on a substrate, have been proposed. For example, there is a technique of electrically connecting the plurality of semiconductor chips to each other in three dimensions, on a substrate, using a through silicon via (TSV) technique. Meanwhile, in accordance with trends of higher performance and higher integration of the semiconductor packages described above, research on methods of effectively dissipating heat, generated during operations involving the semiconductor package, have also been conducted.

SUMMARY

According to an embodiment of the present disclosure, there is provided a stacked semiconductor package. The stacked semiconductor package may include a first die, a second die stacked on a surface of the first die, a heat dissipation layer disposed on the surface, a heat insulation layer disposed on the surface to cover the heat dissipation layer and the first die, a heat sink disposed on the second die, and a heat conduction structure spaced apart from the second die in a lateral direction on the substrate to connect the heat dissipation layer to the heat sink.

According to another embodiment of the present disclosure, there is provided a stacked semiconductor package. The stacked semiconductor package may include a first die, a heat dissipation layer disposed on a surface of the first die to cover at least a portion of the first die, a second die stacked on the surface and connected to the first die by a connection structure, a heat insulation layer disposed on the surface to cover the connection structure, the heat dissipation layer and the first die, a heat sink disposed on the second die, and a heat conduction structure spaced apart from the second die in a lateral direction on the surface to connect the heat dissipation layer to the heat sink.

DETAILED DESCRIPTION

Figure 1:
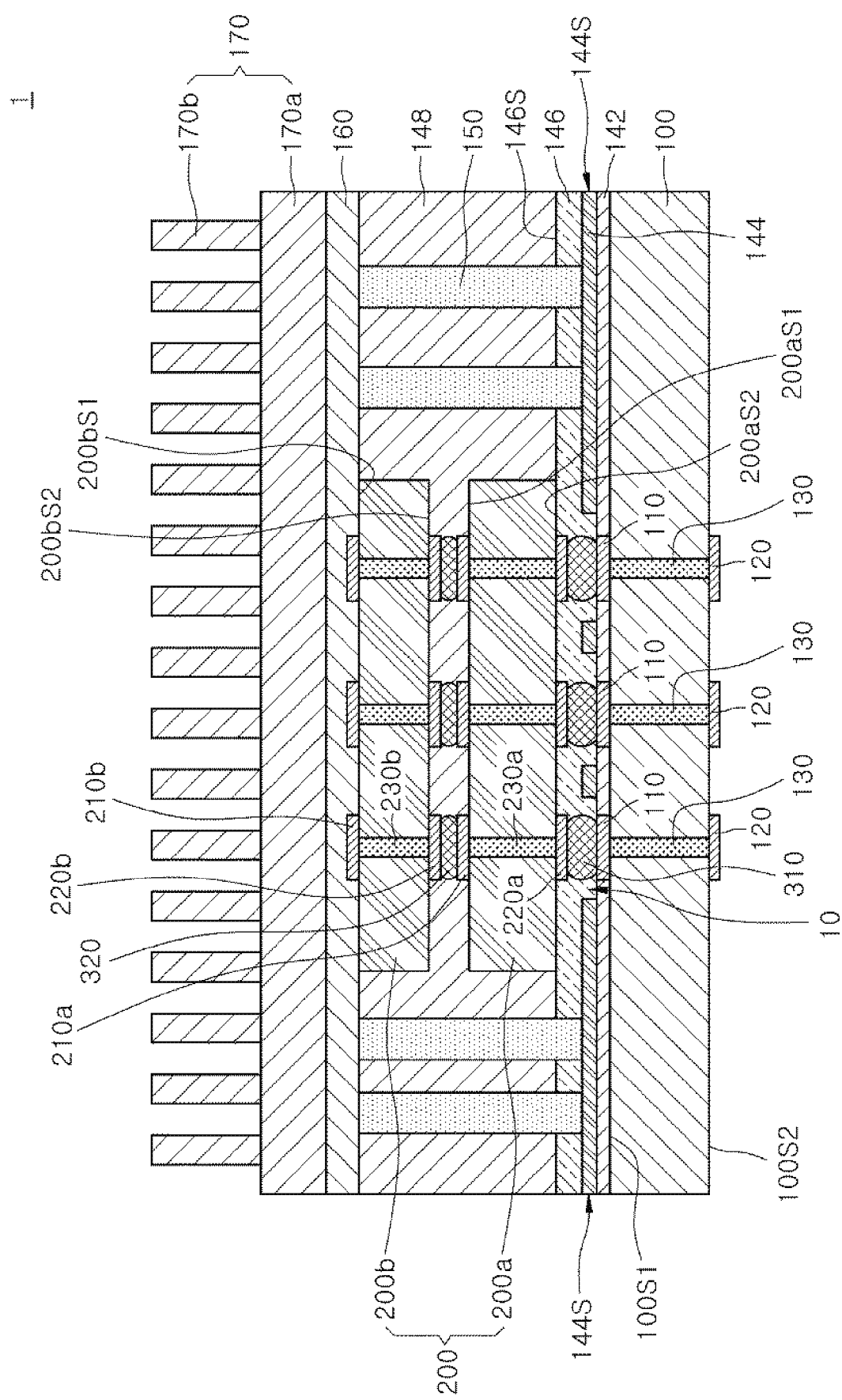
FIG. 1 is a cross-sectional view, illustrating a stacked semiconductor package, according to an embodiment of the present disclosure.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) with the spatially relative descriptors used herein interpreted accordingly.

A semiconductor package described herein may include electronic devices such as semiconductor chips. The semiconductor chips may be obtained by separating a semiconductor substrate, such as a wafer, into a plurality of pieces, using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor chips may be referred to as semiconductor dies according to their shape after the die sawing process.

The semiconductor package may include a package substrate, which the semiconductor chip is mounted on. The package substrate may include at least one layer of integrated circuit patterns and may be referred to as a printed circuit board (PCB). The package substrate may be generally referred to as a substrate.

The semiconductor package may be employed in various communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to other drawings.

FIG. 1 is a cross-sectional view, illustrating a stacked semiconductor package 1, according to an embodiment of the present disclosure.

Referring to FIG. 1, the stacked semiconductor package 1 may include a first die 100, a second die 200 stacked on the first die 100, a heat dissipation layer 144 disposed on a surface of the first die 100, a heat insulation layer 146 disposed on the heat dissipation layer 144 to cover the heat dissipation layer 144 and the first die 100, a heat sink 170 disposed on the second die 200, and heat conduction structures 150 connecting the heat dissipation layer 144 to the heat sink 170. The heat dissipation layer 144 may be disposed to cover at least a portion of the first die 100.

In an embodiment, the stacked semiconductor package 1 may further include an insulation layer 142, disposed between the first die 100 and the heat dissipation layer 144. Moreover, the stacked semiconductor package 1 may further include a mold layer 148 that buries the second die 200 and the heat conduction structure 150 between the first die 100 and the heat sink 170.

The first die 100 may include an integrated circuit. The integrated circuit may include, for example, an analog circuit or a digital circuit which is applied to active devices and passive devices. The integrated circuit may include at least one conductive layer and one insulative layer.

The first die 100 may include a first surface 100S1 and a second surface 100S2. First die upper pads 110 may be disposed on the first surface 100S1 to connect with the second die 200, and first die lower pads 120 may be disposed on the second surface 100S2 to connect with another substrate or another package. In an embodiment, the first die 100 may have through via electrodes 130, connecting the first die upper pad 100 to the first die lower pad 120. The through via electrode 130 may include, for example, a through silicon via (TSV).

In an embodiment, the first die 100 may be a high heating element in comparison to the second die 200. Here, the term "high heating element" is a relative concept. When a semiconductor package includes a plurality of semiconductor dies, if one semiconductor die generates a relatively greater amount of heat compared to the other semiconductor dies during an operation, it may be referred to as a high heating element. On the contrary, if one semiconductor die generates a relatively smaller amount of heat compare to the other semiconductor dies during an operation, it may be referred to as a low heating element. For example, when a semiconductor package includes a processor-based die and a memory die, the processor-based die, that performs logical operations, may be the high heating element, using a lot of power because of the continuous operations that are required during system operation. The memory die, that stores data, may be the low heating element, using relatively little power because the data is input and output only at the request of the processor while the data is stored and maintained.

Accordingly, in an embodiment of the present disclosure, the first die 100 may include a processor, and the second die 200 may include at least one memory chip. The processor may be a logic chip that performs logical operations, an application process (AP) that incorporates logical operations and various functions, a system on chip (SoC), or the like. The memory chip may be, for example, a dynamic random access memory (DRAM) chip, a static random access memory (SRAM) chip, a NAND-type flash memory chip, a NOR-type flash memory chip, a magnetic random access memory (MRAM) chip, a resistive random access memory (ReRAM) chip, a ferroelectric random access memory (FeRAM) chip or a phase change random access memory (PcRAM) chip. In this embodiment, the second die 200 is illustrated as a two-layer stacked structure in which a lower chip 200a and an upper chip 200b are stacked. However, the invention is not limited thereto. In another embodiment, the second die 200 may have a multilayer stacked structure in which three or more memory chips are stacked. In another embodiment, when the first die 100 includes a system-on-chip (SoC), the second die 200 may include various system semiconductor chips that are lower heating elements than the first die 100. The system semiconductor chip may be, for example, a logic chip or an ASIC chip.

Referring to FIG. 1, the second die 200 may be disposed on a region of the first die 100. That is, a surface area of the first die 100 may be larger than a surface area of the second die 200. The second die 200 may include the lower chip 200a and the upper chip 200b, stacked on the lower chip 200a. The lower chip 200a and the upper chip 200b may be homogeneous chips. However, in some other embodiments, the lower chip 200a and the upper chip 200b may be heterogeneous chips.

The lower chip 200a of the second die 200 may have a first surface 200aS1 and a second surface 200aS2. Lower chip upper pads 210a may be disposed on the first surface 200aS1 for bonding with the upper chip 200b, and lower chip lower pads 220a may be disposed on the second surface 200aS2 for bonding with the first die 100. Moreover, the lower chip 200a may have lower chip through electrodes 230a, connecting the lower chip upper pad 210a and the lower chip lower pad 220a. The lower chip through electrode 230a may include, for example, a through silicon via (TSV). The lower chip 200a may be connected to the first die 100 by the first connection structures 310. The first connection structure 310 may include a bump or a solder ball. More specifically, the first connection structure 310 may be disposed between the first die upper pad 110 and the lower chip lower pad 220a.

The upper chip 200b of the second die 200 may have a first surface 200bS1 and a second surface 200bS2. Upper chip upper pads 210b may be disposed on the first surface 200bS1 and upper chip lower pads 220b may be disposed on the second surface 200bS2 for bonding with the lower chip 200a. Moreover, the upper chip 200b may have upper chip through electrodes 230b, connecting the upper chip upper pads 210b and the upper chip lower pads 220b. The upper chip through electrode 230b may include, for example, a through silicon via (TSV). The upper chip 200b may be connected to the lower chip 200a by the second connection structures 320. The second connection structure 320 may include a bump. More specifically, the second connection structure 320 may be disposed between the lower chip upper pad 210a and the upper chip lower pad 220b.

The heat sink 170 may be disposed on the second die 200. The heat sink 170 may include metal, alloy, carbon fiber, or a combination of two or more thereof. For example, the metal may include aluminum (Al), copper (Cu), or the like. The heat sink 170 may have a plate 170a and a plurality of protrusions 170b disposed on the plate 170a. The protrusions 170b can increase a surface area of the heat sink 170 to improve heat dissipation efficiency. A thermal interface material 160 may be disposed between the second die 200 and the heat sink 170. The thermal interface material 160 can lower the thermal contact resistance of the second die 200 and the heat sink 170. By lowering the thermal contact resistance, heat dissipation efficiency from the second die 200 to the heat sink 170 can be increased. For example, the thermal interface material 160 may include polymer resin. Furthermore, the thermal interface material 160 may include thermal grease, thermally conductive reactive compound, thermally conductive elastomer, a polymer adhesive film, or the like.

As described above, the lower chip 200a may be electrically connected to the upper chip 200b by the lower chip lower pads 220a, the lower chip through electrodes 230a, the lower chip upper pads 210a, the second connection structures 320, the upper chip lower pads 220b, the upper chip through electrodes 230b, and the upper chip upper pads 210b. Since the lower chip lower pads 220a, the lower chip through electrodes 230a, the lower chip upper pads 210a, the second connection structures 320, the upper chip lower pads 220b, the upper chip through electrodes 230b, and the upper chip upper pads 210b are made of metal or alloy, the heat generated in the lower chip 200a and the upper chip 200b may be transferred to the heat sink 170 via the thermal interface material 160, which is connected to the upper chip 200b by the upper chip upper pad 210b.

Referring again to FIG. 1, the insulation layer 142 may be disposed on the first surface 100S1 of the first die 100. The upper surface of the insulation layer 142 may be coplanar with the upper surface of the first die upper pad 110. The insulation layer 142 may be disposed to surround the first die upper pads 110 in a lateral direction. The insulation layer 142 may electrically insulate the first die 100 and the heat dissipation layer 144. In other embodiments, when the heat dissipation layer 144 is an electrical insulator, the insulation layer 142 may be omitted. However, in this embodiment, the heat dissipation layer 144 is not in direct contact with the first surface 100S1 of the first die 100.

The heat dissipation layer 144 may be disposed on the insulation layer 142. The heat dissipation layer 144 may serve to conduct the heat generated from the first die 100 in a direction parallel to the first surface 100S1. Through this, the heat dissipation layer 144 can distribute the flow of heat from the first die 100, which is a high heating element, away from the second die 200 in a lateral direction. The lateral transference of heat from the first die to the second die 200 mitigates the thermal burden on the second die 200. The heat distributed in the lateral direction may be discharged to the outside when the heat moves to the heat sink 170, disposed over the second die 200. However, the heat may also be discharged to the outside through a package sidewall surface 144S, via the heat conduction structure 150, which will be described in detail later.

The heat dissipation layer 144 may include metal, alloy, carbon fiber, or a combination of two or more thereof. For example, the metal may include aluminum (Al), copper (Cu), or the like. The heat dissipation layer 144 may be electrically floated. That is, the heat dissipation layer 144 may be disposed to be separated from the circuit wirings of the first die 100 and the second die 200.

The heat dissipation layer 144 may be disposed to cover at least a portion of the first die 100 with the insulation layer 142 disposed therebetween. As the surface area, that the heat dissipation layer 144 covers, increases, the heat dissipation efficiency of the heat dissipation layer 144 may also increase. Moreover, the heat dissipation layer 144 may be disposed on the first surface 100S1 of the first die 100 to extend towards the edges of the first die 100.

Figure 3:
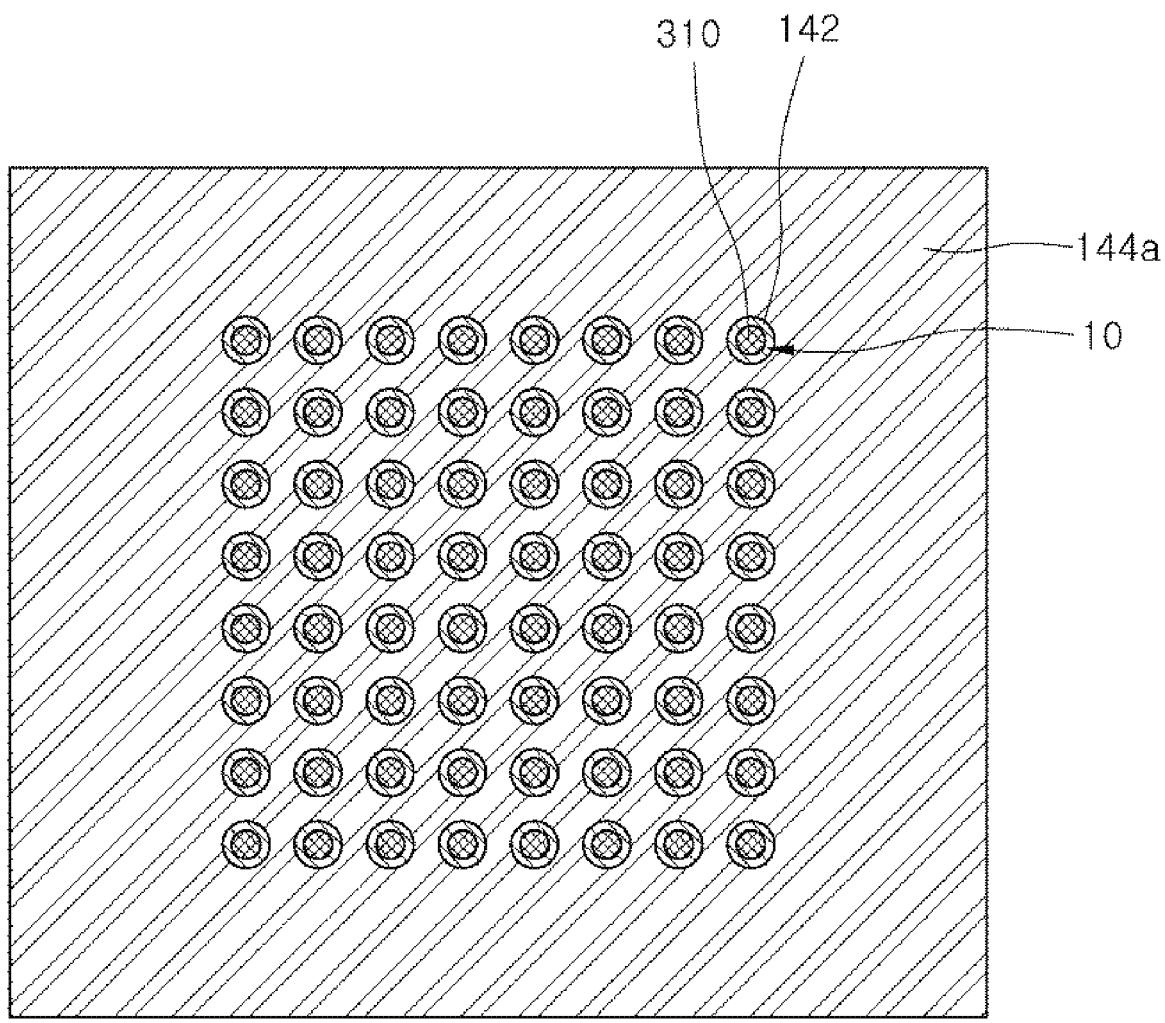
FIG. 3 is a plan view, illustrating a structure on a first surface of a first die of a stacked semiconductor package, according to an embodiment of the present disclosure.
Figure 4:
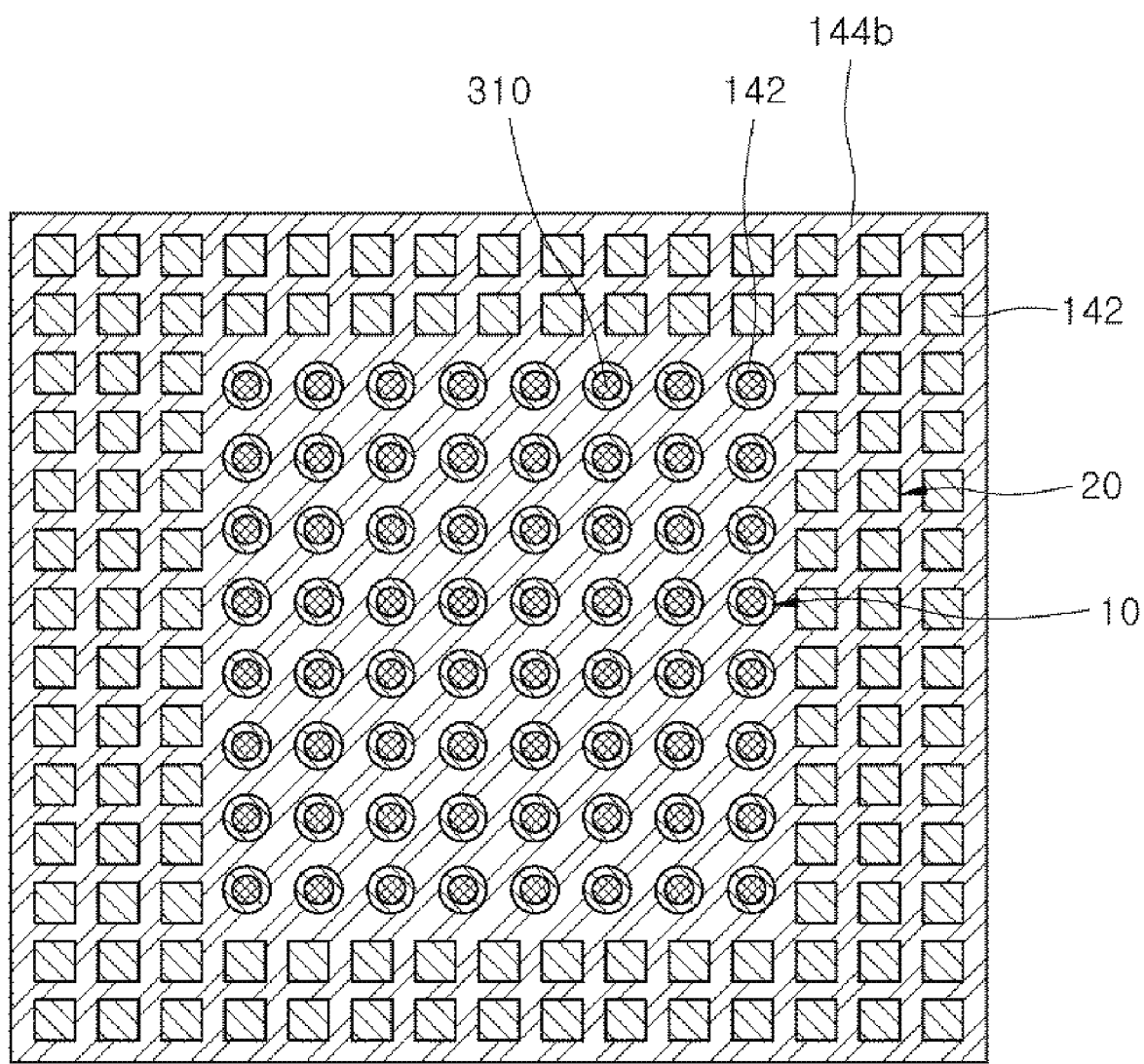
FIG. 4 is a plan view, illustrating a structure on a first surface of a first die of a stacked semiconductor package, according to another embodiment of the present disclosure.

Furthermore, the heat dissipation layer 144 may be spaced apart, by a predetermined distance, from the connection structure 310, in a lateral direction. As illustrated in FIGS. 3 and 4, to be described later, the connection structure 310 may penetrate the heat dissipation layer 144 to be disposed in an opening 10 that selectively exposes the insulation layer 142 and the first die upper pad 110. In an embodiment, the heat dissipation layer 144 may have a higher thermal conductivity than the connection structure 310.

The word "predetermined" as used herein with respect to a parameter, such as a predetermined distance, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Referring again to FIG. 1, the heat insulation layer 146 may be disposed over the first surface 100S1 of the first die 100 to cover the heat dissipation layer 144 and the first die 100. In an embodiment, the heat insulation layer 146 may be disposed to cover at least a portion of the first surface 100S1 of the first die 100, the heat dissipation layer 144, and the connection structures 310. A top surface 146S of the heat insulation layer 146 may be substantially coplanar with the second surface 200aS2 of the lower chip 200a. The heat insulation layer 146 may be interposed between the first and second dies 100 and 200. More specifically, the heat insulation layer 146 may be disposed in a space between the first surface 100S1 of the first die 100 and the second surface 200aS2 of the lower chip 210a.

The heat insulation layer 146 may suppress the heat generated from the first die 100, which is a high heating element, to be conducted in a direction perpendicular to the first surface 100S1 of the first die 100. That is, the heat insulation layer 146 may prevent the heat of the first die 100 from being transferred to the second die 200, thereby reducing the thermal burden of the second die 200. As the surface area, that the heat insulation layer 146 covers, increases, the inhibition rate of heat conduction, from the first die 100, in the vertical direction, may increase. The heat insulation layer 146 may include a material having low heat conductivity. In an embodiment, the heat insulation layer 146 may include oxide, nitride, oxynitride, or the like. In another embodiment, the heat insulation layer 146 may include polymer such as silicone resin or epoxy resin.

Referring again to FIG. 1, heat conduction structures 150 may be disposed over the first surface 100S1 of the first die 100, adjacent to the second die 200. The heat conduction structures 150 may connect the heat dissipation layer 144 and the heat interface material 160 to generate a heat transfer path between the heat dissipation layer 144 and the heat sink 170. In an embodiment, the heat conduction structure 150 may include a heat conductive pillar having a predetermined cross-sectional area and height. The heat conduction structures 150 may conduct heat in a direction perpendicular to the first surface 100S1 of the first die 100. The heat conduction layer 150 may include metal, alloy, carbon fiber, or a combination of two or more thereof. For example, the metal may include aluminum (Al), copper (Cu), or the like.

Furthermore, a mold layer 148 may be disposed between the first die 100 and the heat sink 170 to bury the second die 200 and the heat conduction structure 150. The mold layer 148 may include a known epoxy molding compound (EMC). In other words, the heat conduction structures 150 may contact the heat dissipation layer 144 through the mold layer 148 and the heat insulation layer 146. As the heat conduction structure 150 has a higher thermal conductivity than the mold layer 148 and the heat insulation layer 146, the heat conducted from the first die 100 to the heat dissipation layer 144 may be transferred to the heat sink 170 through the thermal conduction structures 150.

Figure 2:
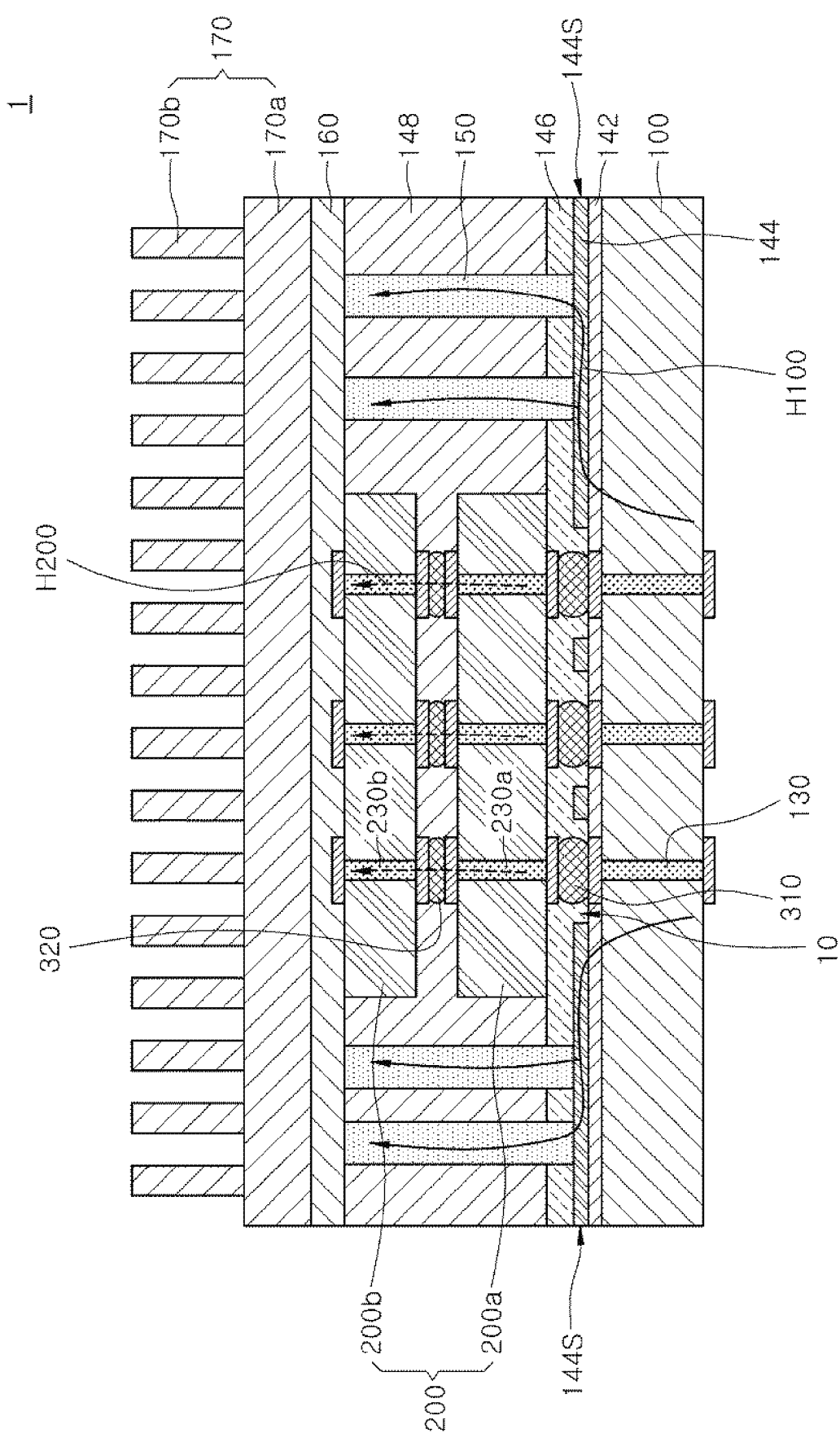
FIG. 2 is a cross-sectional view, illustrating a heat dissipation path of a stacked semiconductor package, according to an embodiment of the present disclosure.

FIG. 2 is a cross-sectional view, illustrating a heat dissipation path of the stacked semiconductor package 1, according to an embodiment of the present disclosure.

Referring to both FIGS. 1 and 2, the heat generated in the first die 100 may be transferred to the heat dissipation layer 144, disposed over the first surface 100S1 of the first die 100. The heat, transferred to the heat dissipation layer 144, may move along the heat dissipation layer 144 in a direction parallel to the first surface 100S1. The heat may then move along the heat conduction structures 150 in a direction perpendicular to the first surface 100S1. Finally, the heat may be transferred, via the thermal interface material 160, to the heat sink 170 and then discharged to the outside. As such, in FIG. 2, a first path H100 is illustrated as an example of the heat transfer path from the first die 100 to the heat sink 170 without passing through the second die 200. In some cases, the heat generated in the first die 100 may be transferred to second die 200 via the through electrodes 130, the first die upper pads 110, the first connection structures 310 and the lower chip lower pads 220a of the first die 100. However, the heat dissipation layer 144 may be configured to have a higher thermal conductivity than the first connection structure 310 based on the thickness or the shape of the heat dissipation layer 144, which suppresses the heat transfer from the first die 100 to the second die 200. In some other embodiments, the heat that moves parallel to the first surface 100S1, along the heat dissipation layer 144, may be discharged to the outside through a side wall surface 144S of the semiconductor package.

Furthermore, the heat generated in the second die 200 may move to the thermal interface material 160 via at least one of the lower chip lower pads 220a, the lower chip through electrodes 230a, the lower chip upper pads 210a, the second connection structures 320, the upper chip lower pads 220b, the upper chip through electrodes 230b and the upper chip upper pads 210b. After reaching the thermal interface material 160, and the heat may then finally be transferred to the heat sink 170. As such, in FIG. 2, a second path H200 is illustrated as an example of a heat transfer path from the second die 200 to the heat sink 170.

As described above, according to an embodiment of the present disclosure, in the stacked semiconductor package 1, the heat dissipation paths of the first die 100 and the second die 200 may be separated from each other. Accordingly, the thermal burden of the second die 200, which is stacked on top of the high heating element first die 100, may be reduced. As a result, the operation reliability of the semiconductor chip, in the stacked semiconductor package 1, may be improved. For example, it is possible to avoid the phenomenon in which the heat generated in the first die 100 is transferred to the second die 200, leading to the deterioration of the operation characteristics of the second die 200 when the added heat from the first die 100 increases the temperature of the second die 200 over the acceptable limit. Such operation characteristics may include, for example, refresh characteristics of DRAM devices, retention times of NAND memory devices, or the like.

FIG. 3 is a plan view, illustrating a structure on a first surface 100S1 of a first die 100 of a stacked semiconductor package 1, according to an embodiment of the present disclosure. More specifically, FIG. 3 schematically illustrates the shape of a heat dissipation layer 144a, disposed on the first surface 100S1 of the first die 100. The heat dissipation layer 144a may correspond to the heat dissipation layer 144 of the stacked semiconductor package described above with reference to FIGS. 1 and 2.

Referring to FIG. 3, the heat dissipation layer 144a may be disposed on an insulation layer 142. Meanwhile, first connection structures 310, connecting the first die 100 to a lower chip (200a of FIG. 1), may be disposed in openings 10 that penetrate the heat dissipation layer 144a. Referring to FIGS. 1-3, the openings 10 may selectively expose the first die upper pads 110 and the insulation layer 142. The first connection structures 310 may be spaced apart from the heat dissipation layer 144a in the lateral direction on the first die upper pads 110 as shown in FIG. 1.

The first connection structures 310 may be densely arranged in a central region of the first die 100. In addition, other regions except the central region, where the first connection structures 310 are arranged, may be covered by the heat dissipation layer 144a. As the area of the region covered by the heat dissipation layer 144a increases, the heat dissipation efficiency through the heat dissipation layer 144a may be increased.

FIG. 4 is a plan view, illustrating a structure on a first surface 100S1 of a first die 100 of a stacked semiconductor package 1, according to another embodiment of the present disclosure. More specifically, FIG. 4 schematically illustrates the shape of a heat dissipation layer 144b, disposed on the first surface 100S1 of the first die 100.

The heat dissipation layer 144b, of FIG. 4, may further include openings 20 as compared with the heat dissipation layer 144a of FIG. 3. The openings 20 may be formed in other regions except the central region, where the first connection structures 310 are arranged. The openings 20 may serve to relax the thermal stress between the heat dissipation layer 144b and the insulation layer 142, thereby preventing the heat dissipation layer 144b from being separated from the insulation layer 142. For example, when the insulation layer 142 and the heat insulation layer 146 are formed of a polymer material, and the heat dissipation layer 144b is formed of metal, the interlayer bonding strength may be insufficient, and peeling may occur. As the insulation layer 142 and the heat insulation layer 146 directly and tightly contact each other through the openings, defects due to the lack of a bonding force may be overcome. The openings 20 may be formed in various sizes and densities based on the magnitude of the thermal stress.

As described above, various embodiments of the present disclosure may provide heat dissipation structures in which the heat generated in a first die, which is a relatively high heating element, may be effectively discharged to the outside through a heat sink or a package sidewall surface without passing through a second die, in a stacked semiconductor package with the second die stacked on the first die. Accordingly, the operation reliability of the semiconductor chip in the stacked semiconductor package may be improved.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A stacked semiconductor package comprising:
    a first die;
    a second die stacked on a surface of the first die;
    a heat dissipation layer disposed on the surface;
    a heat insulation layer disposed on the surface to cover the heat dissipation layer and the first die;
    a heat sink disposed on the second die; and
    a heat conduction structure spaced apart from the second die in a lateral direction on the surface to connect the heat dissipation layer to the heat sink,
    wherein the heat insulation layer covers at least a portion of an upper surface of the heat dissipation layer, and
    wherein the stacked semiconductor package further comprises a mold layer burying the second die and the heat conduction structure between the first die and the heat sink.

2. The stacked semiconductor package of claim 1, wherein the heat dissipation layer is disposed to cover at least a portion of the first die.

3. The stacked semiconductor package of claim 1,
    wherein the heat dissipation layer is disposed on the surface to extend towards edges of the first die, and
    wherein the heat insulation layer is interposed between the first and second dies.

4. The stacked semiconductor package of claim 1,
    wherein the first die and the second die are coupled to each other by a connection structure, and
    wherein the heat dissipation layer is spaced apart from the connection structure in a lateral direction.

5. The stacked semiconductor package of claim 1, wherein the heat dissipation layer comprises at least one of metal, alloy, and carbon fiber.

6. The stacked semiconductor package of claim 1,
    wherein each of the first and second dies comprises a circuit wiring, and
    wherein the heat dissipation layer is separated from the circuit wiring and is electrically floated.

7. The stacked semiconductor package of claim 6, further comprising:
    an insulation layer disposed between the first die and the heat dissipation layer.

8. The stacked semiconductor package of claim 1, wherein the first die is a higher heating element in comparison to the second die.

9. The stacked semiconductor package of claim 8,
    wherein the first die comprises a processor, and
    wherein the second die comprises at least one memory chip.

10. The stacked semiconductor package of claim 9, wherein the at least one memory chip has a through electrode.

11. The stacked semiconductor package of claim 1, wherein an interface between the heat insulation layer and the second die is coplanar with an interface between the heat insulation layer and the mold layer.

12. The stacked semiconductor package of claim 1, wherein the heat conduction structure comprises:
    a conductive pillar having predetermined cross-sectional area and height.

13. The stacked semiconductor package of claim 1, wherein the heat dissipation layer comprises openings configured to compensate for thermal stress.

14. A stacked semiconductor package comprising:
    a first die;
    a heat dissipation layer disposed on a surface of the first die to cover at least a portion of the first die;
    a second die stacked on the surface and connected to the first die by a connection structure;
    a heat insulation layer disposed on the surface to cover the connection structure, the heat dissipation layer, and the first die;
    a heat sink disposed on the second die; and
    a heat conduction structure spaced apart from the second die in a lateral direction on the surface to connect the heat dissipation layer to the heat sink,
    wherein the heat insulation layer covers at least a portion of an upper surface of the heat dissipation layer, and
    wherein the stacked semiconductor package further comprises a mold layer burying the second die and the heat conduction structure between the first die and the heat sink.

15. The stacked semiconductor package of claim 14,
    wherein the heat dissipation layer is disposed on the surface to extend towards edges of the first die, and
    wherein the heat insulation layer is interposed between the first and second dies.

16. The stacked semiconductor package of claim 14,
    wherein an interface between the heat insulation layer and the second die is coplanar with an interface between the heat insulation layer and the mold layer.

17. The stacked semiconductor package of claim 14, further comprising:
    an insulation layer disposed between the first die and the heat dissipation layer.

18. The stacked semiconductor package of claim 14,
    wherein each of the first and second dies comprises a circuit wiring, and
    wherein the heat dissipation layer is separated from the circuit wiring and is electrically floated.

19. The stacked semiconductor package of claim 14, wherein the heat conduction structure comprises:
    a conductive pillar having predetermined cross-sectional area and height.

20. The stacked semiconductor package of claim 14,
    wherein the first die and the second die are coupled to each other by a connection structure, and
    wherein the heat dissipation layer is spaced apart from the connection structure in a lateral direction.

* * * * *